United States Patent
Kim et al.

(10) Patent No.: US 7,423,927 B2
(45) Date of Patent: Sep. 9, 2008

(54) WAVE PIPELINED OUTPUT CIRCUIT OF SYNCHRONOUS MEMORY DEVICE

(75) Inventors: Joung-yeal Kim, Yongin-si (KR); Seong-jin Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 11/504,897

(22) Filed: Aug. 16, 2006

(65) Prior Publication Data
US 2007/0043921 A1   Feb. 22, 2007

(30) Foreign Application Priority Data
Aug. 17, 2005   (KR) ............... 10-2005-0075248

(51) Int. Cl.
*G11C 8/00* (2006.01)
(52) U.S. Cl. ............ 365/233; 365/189.05; 365/189.12; 365/230.03; 365/230.05
(58) Field of Classification Search ........... 365/233, 365/189.05, 189.12, 230.03, 230.05
See application file for complete search history.

(56) References Cited

U.S. PATENT DOCUMENTS 5,384,737 A * 1/1995 Childs et al. .......... 365/189.05
5,933,369 A * 8/1999 Johnson et al. ........ 365/189.05
5,978,311 A   11/1999 Wilford et al. ............. 365/233

FOREIGN PATENT DOCUMENTS

JP         11-265581      9/1999
KR        1999-0086391    12/1999

* cited by examiner

*Primary Examiner*—Pho M. Luu
(74) *Attorney, Agent, or Firm*—Mills & Onello LLP

(57) ABSTRACT

Provided is a wave pipelined output circuit of a synchronous memory device. In the wave pipelined output circuit, paths for transferring data in a high frequency mode of the synchronous memory device are separated from paths for transferring the data in a low frequency mode of the synchronous memory device. The number of registers included in data output paths in the high frequency mode is reduced and the number of control signals used for data input/output of the registers is also reduced. Consequently, loads of the data output paths in the high frequency mode are decreased to improve a high frequency operation and reduce the chip area of the output circuit.

16 Claims, 6 Drawing Sheets

WAVE PIPELINED OUTPUT CIRCUIT OF SYNCHRONOUS MEMORY DEVICE

CROSS-REFERENCE TO RELATED PATENT APPLICATION

This application claims the benefit of Korean Patent Application No. 10-2005-0075248, filed on Aug. 17, 2005, in the Korean Intellectual Property Office, the contents of which are incorporated herein in their entirety by reference.

BACKGROUND OF THE INVENTION

1. Field of the Invention

The present invention relates to a synchronous memory device, and more particularly, to a wave pipelined output circuit of a synchronous memory device.

2. Description of the Related Art

In general, a synchronous memory device uses various pipeline structures to increase a data output rate on a data output path. Among the various pipeline structures, a wave pipeline structure using a plurality of registers in an output circuit has a relatively simple circuit, occupies a small chip area and increases the operating speed of the circuit so that it is widely used in the synchronous memory device. An example of a conventional synchronous memory device having a general pipeline structure is disclosed in U.S. Pat. No. 5,384,737.

FIG. 1 is a block diagram of a conventional wave pipelined synchronous memory device. Referring to FIG. 1, the conventional wave pipelined synchronous memory device includes a memory cell array 11, a bitline sense amplifier 12, a column selecting gate 13, an input/output line sense amplifier 14, a burst ordering unit 15, and a wave pipelined output circuit 16.

The wave pipelined output circuit 16 latches data DATA_IN0 through DATA_IN3 which are read from the memory cell array 11 and inputted thereto in parallel via the bitline sense amplifier 12, the column selecting gate 13, the input/output line sense amplifier 14 and the burst ordering unit 15 in response to a plurality of latch control signals DL0 through DL3 and outputs the latched data as output data DATA_OUT in response to a plurality of output control signals CDQ_F/CDQ_S. The output data DATA_OUT is output to the outside via an output buffer (not shown) and an output pin (not shown).

FIG. 2 illustrates the configuration of the wave pipelined output circuit 16 of FIG. 1, and FIG. 3 is a timing diagram of the output circuit. Referring to FIG. 2, the output circuit 16 includes input multiplexers 211, 212, 213 and 214, registers 231 through 246, and output multiplexers 251, 252, 253 and 254. In FIG. 2, data DATA_IN inputted in parallel is 4-bit data and the number of the registers is 16.

Each of the input multiplexers 211, 212, 213 and 214 receives corresponding input data and outputs the input data to corresponding four registers in response to four latch control signals DL0, DL1, DL2 and DL3. Each of the output multiplexers 251, 252, 253 and 254 sequentially outputs the data latched in the corresponding four registers to a node DOFi or DOSi in response to corresponding four first output control signals CDQ_F or four second output control signals CDQ_S. For example, the input multiplexer 211 receives input data DATA_IN0 and outputs the input data DATA_IN0 to the four registers 231, 232, 233 and 234 in response to the four latch control signals DL0, DL1, DL2 and DL3. The output multiplexer 251 sequentially outputs the data latched in the four registers 231, 232, 233 and 234 to the node DOFi in response to the four first output control signals CDQ0_F, CDQ2_F, CDQ4_F and CDQ6_F.

The data of the node DOFi are sequentially output as output data DATA_OUT in response to a first output clock signal CLKDQ_F and the data of the node DOSi are sequentially output as output data DATA_OUT in response to a second output clock signal CLKDQ_S.

The number of the registers included in the wave pipelined output circuit is determined by maximum column address strobe (CAS) latency. The CAS latency represents the number of cycles of an operating clock signal included in a period of time from application of a read command to the synchronous memory device till output of data to the outside.

However, the number of the registers included in the wave pipelined output circuit is rapidly increased because the output circuit should operate in a wide frequency range from a high frequency to a low frequency. The increment in the number of the registers increases loads of data output paths in the output circuit to restrict a high frequency operation and augments the chip area of the output circuit.

SUMMARY OF THE INVENTION

The present invention provides a wave pipelined output circuit for reducing the load of a data output path to improve a high frequency operation and decreasing the chip area thereof.

According to an aspect of the present invention, there is provided a wave pipelined output circuit of a synchronous memory device including a data output unit latching data input through input ports in response to a plurality of latch control signals and outputting the latched data in response to a plurality of output control signals, first paths transferring data read from a memory cell array to the input ports of the data output unit in a high frequency mode of the synchronous memory device, and second paths delaying the read data by a predetermined number of clock cycles and then transferring the delayed data to the input ports of the data output unit in a low frequency mode of the synchronous memory device.

In one embodiment, each of the first paths includes a latch latching the read data in response to a control signal activated in the high frequency mode, and a selector receiving the data latched in the latch and outputting the data to the corresponding input port of the data output unit. Each of the second paths can include a latch latching the read data in response to a control signal activated in the low frequency mode, and a plurality of delay circuits which are serially connected to the output port of the latch and delaying data input through the input ports thereof by one clock cycle, and a selector receiving the output signal of the last delay circuit of the plurality of delay circuits and outputting the output signal to the corresponding input port of the data output unit. In one embodiment, each of the delay circuits comprises a register. In one embodiment, the delay control clock signal has the same cycle as that of the operating clock signal of the synchronous memory device.

In one embodiment, the high frequency mode is a mode in which a delay locked loop circuit included in the synchronous memory device is operated. The low frequency mode can be a mode in which the delay locked loop circuit is not operated.

In one embodiment, the data output unit comprises: a plurality of registers; input multiplexers outputting data input through the input ports via the first paths or the second paths to the plurality of registers in response to the plurality of latch control signals; and output multiplexers sequentially outputting the data latched in the plurality of registers in response to the plurality of output control signals.

According to another aspect of the present invention, there is provided a wave pipelined output circuit of a synchronous memory device including a data output unit receiving data read from a memory cell array through input ports, latching the data in response to a plurality of latch control signals and outputting the latched data in response to a plurality of output control signals, first paths transferring the data output from the data output unit to output ports in a high frequency mode of the synchronous memory device, and second paths delaying the data output from the data output unit by a predetermined number of clock cycles and then transferring the delayed data to the output ports in a low frequency mode of the synchronous memory device.

In one embodiment, each of the first paths includes a latch latching the data output from the data output unit in response to a control signal activated in the high frequency mode, and a selector receiving the data latched in the latch and outputting the data to the corresponding output port. Each of the second paths can include a latch latching the data output from the data output unit in response to a control signal activated in the low frequency mode, a plurality of delay circuits which are serially connected to the output port of the latch and delaying data input through the input ports thereof by one clock cycle, and a selector receiving the output signal of the last delay circuit of the plurality of delay circuits and outputting the output signal to the corresponding output. In one embodiment, each of the delay circuits includes a register storing data input to the input port thereof in response to a delay control clock signal. In one embodiment, the delay control clock signal has the same cycle as that of the operating clock signal of the synchronous memory device.

In one embodiment, the high frequency mode is a mode in which a delay locked loop circuit included in the synchronous memory device is operated. In one embodiment, the low frequency mode is a mode in which the delay locked loop circuit is not operated.

In one embodiment, the data output unit comprises: a plurality of registers; input multiplexers receiving data read from the memory cell array and outputting the data to the plurality of registers in response to the plurality of latch control signals; and output multiplexers sequentially outputting the data latched in the plurality of registers in response to the plurality of output control signals.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 4:
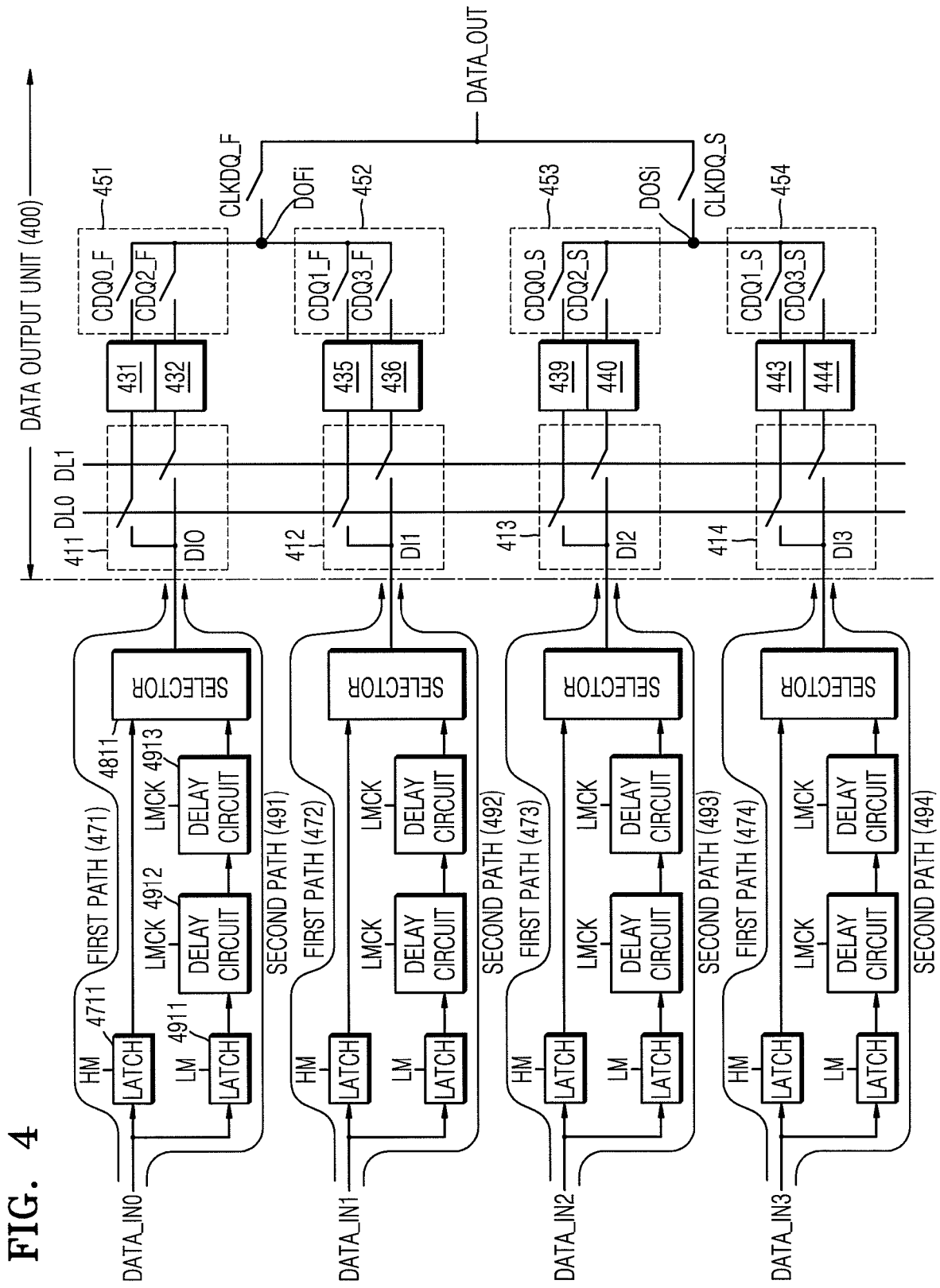
FIG. 4 is a block diagram of a wave pipelined output circuit according to a first embodiment of the present invention.

FIG. 4 is a block diagram of a wave pipelined output circuit according to a first embodiment of the present invention. Referring to FIG. 4, the output circuit according to the first embodiment of the present invention includes first paths 471, 472, 473 and 474 for transferring data in a high frequency mode of a synchronous memory device, second paths 491, 492, 493 and 494 for transferring the data in a low frequency mode of the synchronous memory device, and a data output unit 400 outputting the data input through the first paths 471, 472, 473 and 474 or the second paths 491, 492, 493 and 494 in a wave pipelined manner.

The first paths 471, 472, 473 and 474 transfer data DATA_IN0, DATA_IN1, DATA_IN2 and DATA_IN3 read from a memory cell array (not shown) to input ports DI0, DI1, DI2 and DI3 of the data output unit 400, respectively, in the high frequency mode of the synchronous memory device. The second paths 491, 492, 493 and 494 delay the data DATA_IN0, DATA_IN1, DATA_IN2 and DATA_IN3 read from the memory cell array by a predetermined number of clock cycles and then transfer the delayed data to the input ports DI0, DI1, DI2 and DI3 of the data output unit 400, respectively, in the low frequency mode of the synchronous memory device.

The data output unit 400 latches the data DATA_IN0, DATA_IN1, DATA_IN2 and DATA_IN3 input through the input ports DI0, DI1, DI2 and DI3 via the first paths 471, 472, 473 and 474 or the second paths 491, 492, 493 and 494 in response to a plurality of latch control signals DL0 and DL1 and outputs the latched data as output data DATA_OUT in response to a plurality of output control signals CDQ_F/CDQ_S. The output data DAT_OUT is output to the outside through an output buffer (not shown) and an output pin (not shown).

More specifically, each of the first paths 471, 472, 473 and 474 includes a latch 4711 controlled by a high frequency mode control signal HM and a selector 4811. The latch 4711 latches the read data DATA_IN0, DATA_IN1, DATA_IN2 and DATA_IN3 in response to the control signal HN activated in the high frequency mode. The latched data is output to the input ports DI0, DI1, DI2 and DI3 of the data output unit 400 through the selector 4811.

Figure 3:
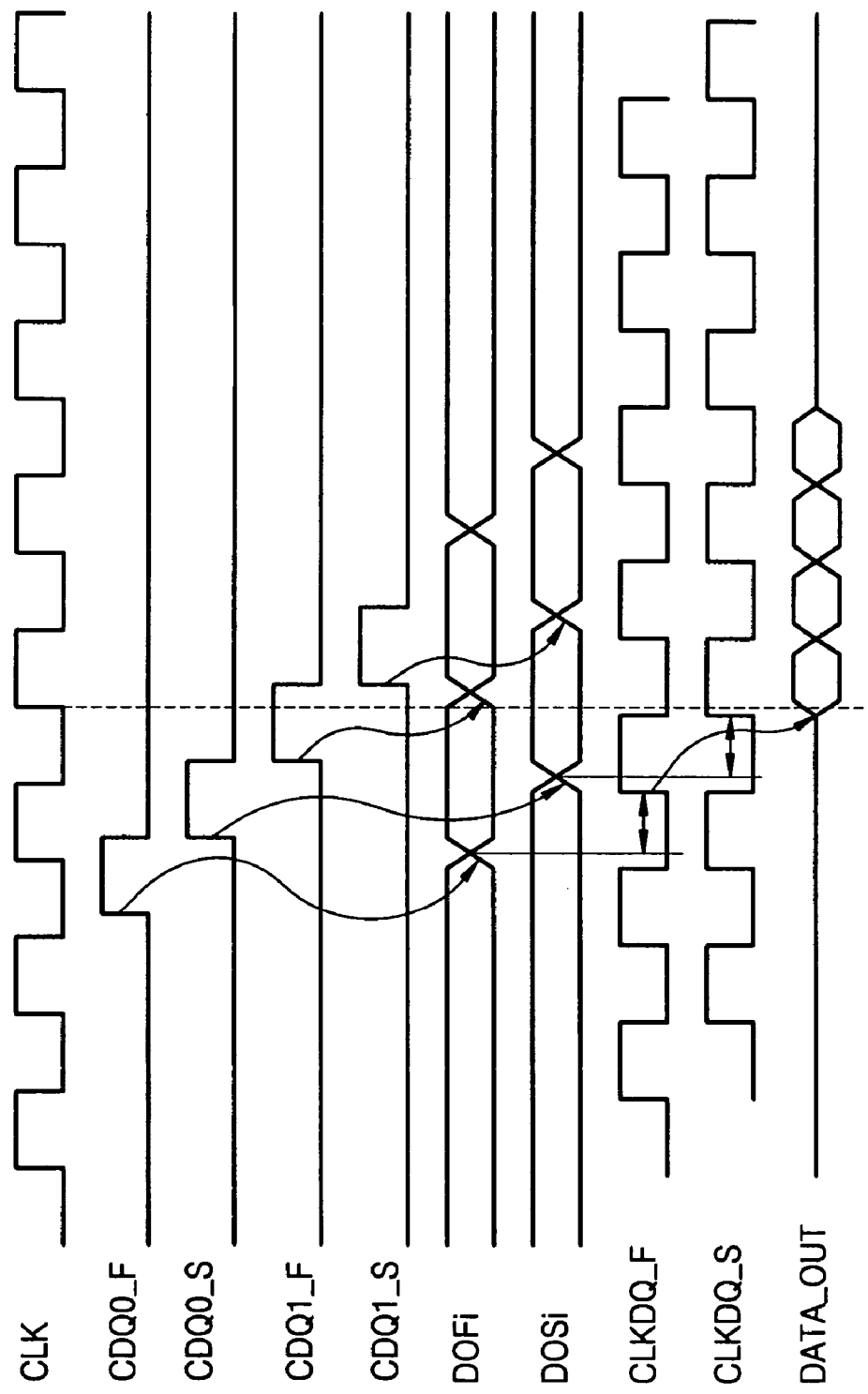
FIG. 3 is an operation timing diagram of the output circuit of FIG. 2.

Each of the second paths 491, 492, 493 and 494 includes a latch 4911 controlled by a low frequency mode control signal LM, a plurality of delay circuits 4912 and 4913 controlled by a delay control clock signal LMCK, and the selector 4811. FIG. 4 shows that each of the second paths 491, 492, 493 and 494 includes the two delay circuits 4912 and 4913. The latch 4911 latches the read data DATA_IN0, DATA_IN1, DATA_IN2 and DATA_IN3 in response to the control signal LM activated in the low frequency mode. The delay circuits 4912 and 4913 are serially connected and respectively delay data input thereto by one clock cycle in response to the delay control clock signal LMCK. The delay control clock signal LMCK has the same cycle as that of the clock signal CLK shown in FIG. 3.

Preferably, the delay circuits 4912 and 4913 are composed of registers storing data input to their input ports in response to the delay control clock signal LMCK. However, the delay circuits 4912 and 4913 can have various circuit configurations.

In the present invention, the high frequency mode is defined as a mode in which a delay locked loop circuit included in the synchronous memory device is operated and the low frequency mode is defined as a mode in which the delay locked loop circuit is not operated. However, a case where the delay locked loop circuit is operated at a frequency higher than a predetermined frequency of a clock signal can be defined as the high frequency mode and a case where the delay locked loop circuit is operated at a frequency lower than the predetermined frequency of the clock signal can be defined as the low frequency mode if required.

The data output unit 400 includes input multiplexers 411, 412, 413 and 414, registers 431, 432, 435, 436, 439, 440, 443 and 444, and output multiplexers 451, 452, 453 and 454. Each of the input multiplexers 411, 412, 413 and 414 outputs data input through its input ports DI0, DI1, DI2 or DI3 to corresponding two registers in response to two latch control signals DL0 and DL1.

Specifically, the input multiplexer 411 outputs the data DAT_IN0 input through its input port DI0 via the first path 471 or the second path 491 to two registers 431 and 432 in response to the two latch control signals DL0 and DL1. The input multiplexer 412 outputs the data DAT_IN1 input through its input port DI1 via the first path 472 or the second path 492 to two registers 435 and 436 in response to the two latch control signals DL0 and DL1. The input multiplexer 413 outputs the data DAT_IN2 input through its input port DI2 via the first path 473 or the second path 493 to two registers 439 and 440 in response to the two latch control signals DL0 and DL1. The input multiplexer 414 outputs the data DAT_IN3 input through its input port DI3 via the first path 474 or the second path 494 to two registers 443 and 444 in response to the two latch control signals DL0 and DL1.

Each of the output multiplexers 451, 452, 453 and 454 sequentially outputs the data latched in corresponding two registers to a node DOFi or DOSi in response to two first output control signals CDQ_F or two second output control signals CDQ_S. Specifically, the output multiplexer 451 sequentially outputs the data latched in the corresponding two registers 431 and 432 to the node DOFi in response to corresponding two first control signals CDQ0_F and CDQ2_F. The output multiplexer 452 sequentially outputs the data latched in the corresponding two registers 435 and 436 to the node DOFi in response to corresponding two first control signals CDQ1_F and CDQ3_F. The output multiplexer 453 sequentially outputs the data latched in the corresponding two registers 439 and 440 to the node DOSi in response to corresponding two second control signals CDQ0_S and CDQ2_S. The output multiplexer 454 sequentially outputs the data latched in the corresponding two registers 443 and 444 to the node DOSi in response to corresponding two second control signals CDQ1_S and CDQ3_S.

The data of the node DOFi are sequentially output as the output data DATA_OUT in response to a first output clock signal CLKDQ_F and the data of the node DOSi are sequentially output as the output data DATA_OUT in response to a second output clock signal CLKDQ_S.

The latch control signals DL0 and DL1 controlling the data input through the input ports DI0, DI1, DI2 and DI3 to be stored in the registers 431, 432, 435, 436, 439, 440, 443 and 444 and the output control signals CDQ_F/CDQ_S controlling the data stored in the registers 431, 432, 435, 436, 439, 440, 443 and 444 to be output are related with CAS latency CL of the synchronous memory device. The CAS latency CL represents the number of clock cycles included in a period time starting from application of a read command to the synchronous memory device to output of the read command to the outside.

Figure 1:
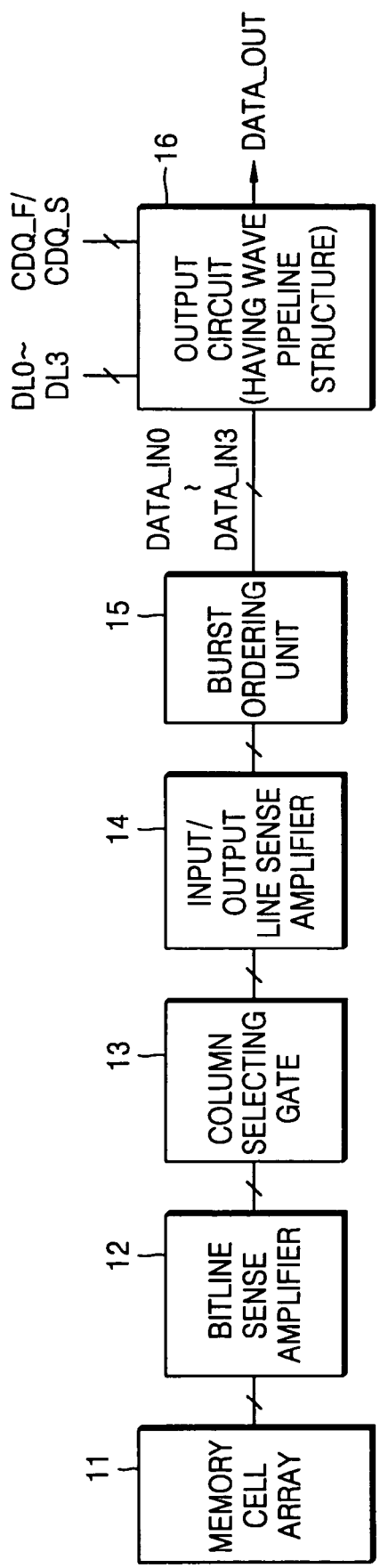
FIG. 1 is a block diagram of a conventional wave pipelined synchronous memory device.
Figure 2:
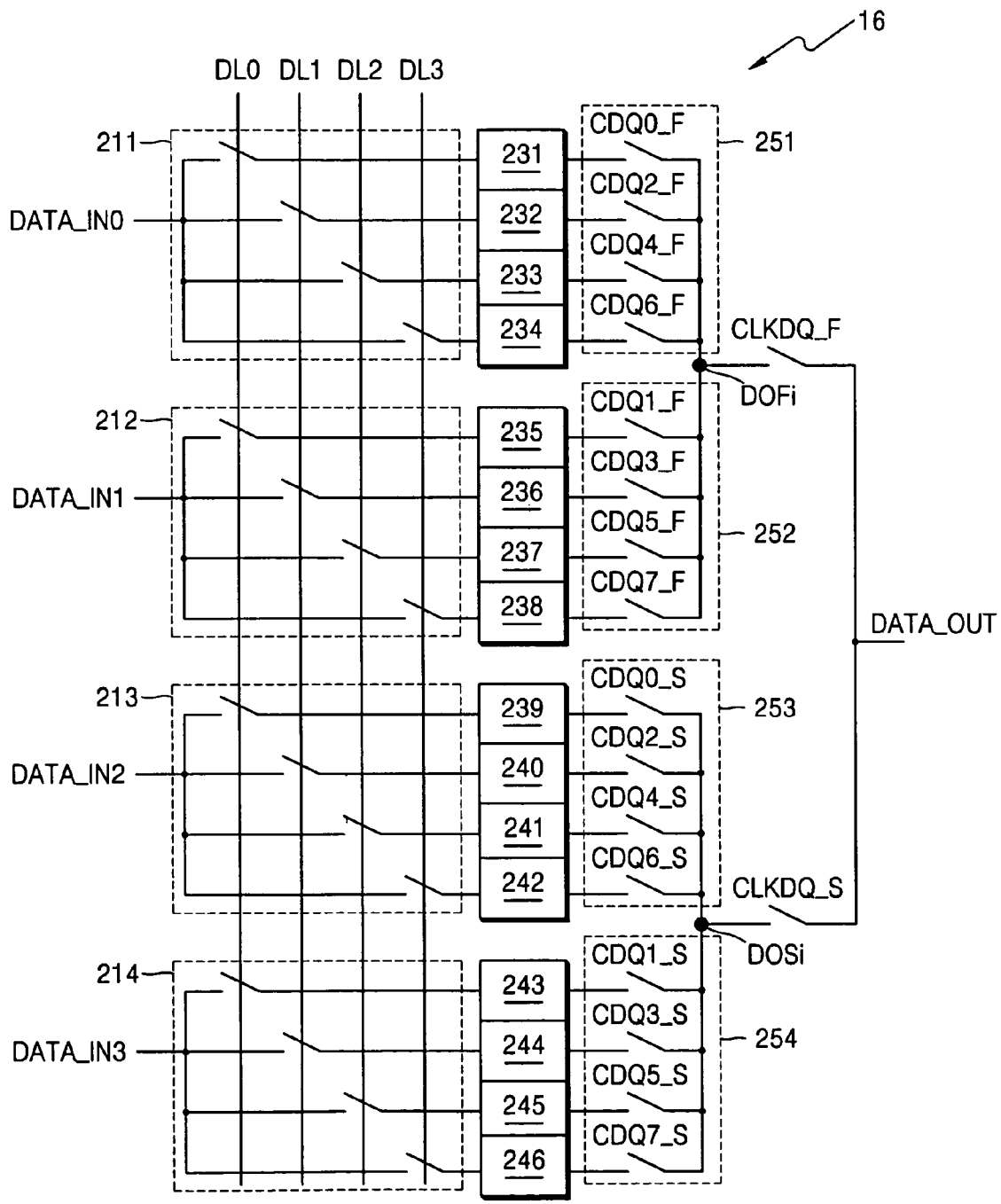
FIG. 2 illustrates the configuration of the wave pipelined output circuit of FIG. 1.

In the aforementioned wave pipelined output circuit according to the present invention, the paths transferring data in the high frequency mode are separated from the paths transferring data in the low frequency mode. Furthermore, the number of the registers included in the output circuit, corresponding to the input multiplexers 411, 412, 413 and 414, is reduced from four to two compared to the conventional wave pipelined output circuit shown in FIG. 2. Accordingly, the output circuit of the present invention includes only eight registers while the conventional output circuit includes sixteen registers.

The reason why the number of registers in the wave pipelined output circuit according to the resent invention will now be described.

The CAS latency CL is determined by the cycle tCC of an operating clock signal CLK and time tAA ranging from application of a read command to output of the read command to the outside. That is, the CAS latency CL must be larger than or identical to the value obtained by dividing tAA by tCC. Here, tAA is a value physically fixed to the synchronous memory device and tCC is a value variable by a user.

The CAS latency CL is gradually increased because an operating frequency is gradually increased for a high speed operation (that is, the cycle tCC of the operating clock signal CLK is gradually shortened) while tAA is physically fixed. However, the wave pipelined output structure requires registers in order to secure high CAS latency at a low operating frequency and the number of the registers is determined by maximum CAS latency.

The wave pipelined output circuit generally requires a large number of registers because it should be operated over a wide frequency range from a high frequency to a low frequency. For example, when tAA is 16 ns and tCC corresponding to the maximum operating frequency is 2 ns, the maximum CAS latency is 8 and the number of registers required for a double data rate (DDR) synchronous memory device corresponds to twice the maximum CAS latency, that is, 16.

The number of registers actually required according to the operating frequency corresponds to a value obtained by subtracting (tAA1/actual operating clock cycle tCC)*2 from (maximum CAS latency CL)*2. Here, tAA1 represents a period of time starting from the application of the read command to storing data in the registers. Accordingly, the number of the registers actually required according to the operating frequency corresponds to the value obtained by subtracting twice the number of operating clock cycles included in the period of time starting from the application of the read command to storing data in the registers from twice the maximum CAS latency CL (that is, twice the number of cycles of the operating clock signal CLK for the period of time from the application of the read command to storing data in the registers).

Accordingly, the number of registers actually required at a minimum frequency of the operating clock signal CLK becomes the maximum and the number of registers actually required at a maximum frequency becomes the minimum. If the maximum CAS latency is 8, tAA1 is 12 ns, and the actual operating clock cycle tCC is 3 ns, the number of actually required registers is about 8 and thus about eight registers can be reduced.

Accordingly, in the wave pipelined output circuit according to the present invention, the first paths 471, 472, 473 and 474 transferring data in the high frequency mode in which the delay clocked loop circuit is operated are separated from the second paths 491, 492, 493 and 494 transferring the data in the low frequency mode in which the delay locked loop circuit is not operated using the aforementioned principle. Furthermore, the number of the registers corresponding to each of the input multiplexers 411, 412, 413 and 414 is reduced from four to two. Moreover, the delay circuits 4912 and 4913 (composed of registers) as many as the reduced number of registers are included in each of the second paths 491, 492, 493 and 494 transferring the data in the low frequency mode.

With this configuration, the two registers corresponding to each of the input multiplexers 411, 412, 413 and 414 are used and thus a total eight registers are used in the high frequency mode. On the contrary, the two delay circuits 4912 and 4913 (two registers) included in each of the second paths and the two registers corresponding to each of the input multiplexers 411, 412, 413 and 414, that is, a total of sixteen registers, are used in the low frequency mode.

Accordingly, the number of the registers used in the high frequency mode, the number of the latch control signals DL0 and DL1 and the number of the output control signals CDQ_F/CDQ_S are reduced in the output circuit of the present invention compared to the conventional output circuit. Consequently, loads of the data output paths in the high frequency mode are reduced and thus the high frequency operation is improved and the chip area of the output circuit is decreased.

Figure 5:
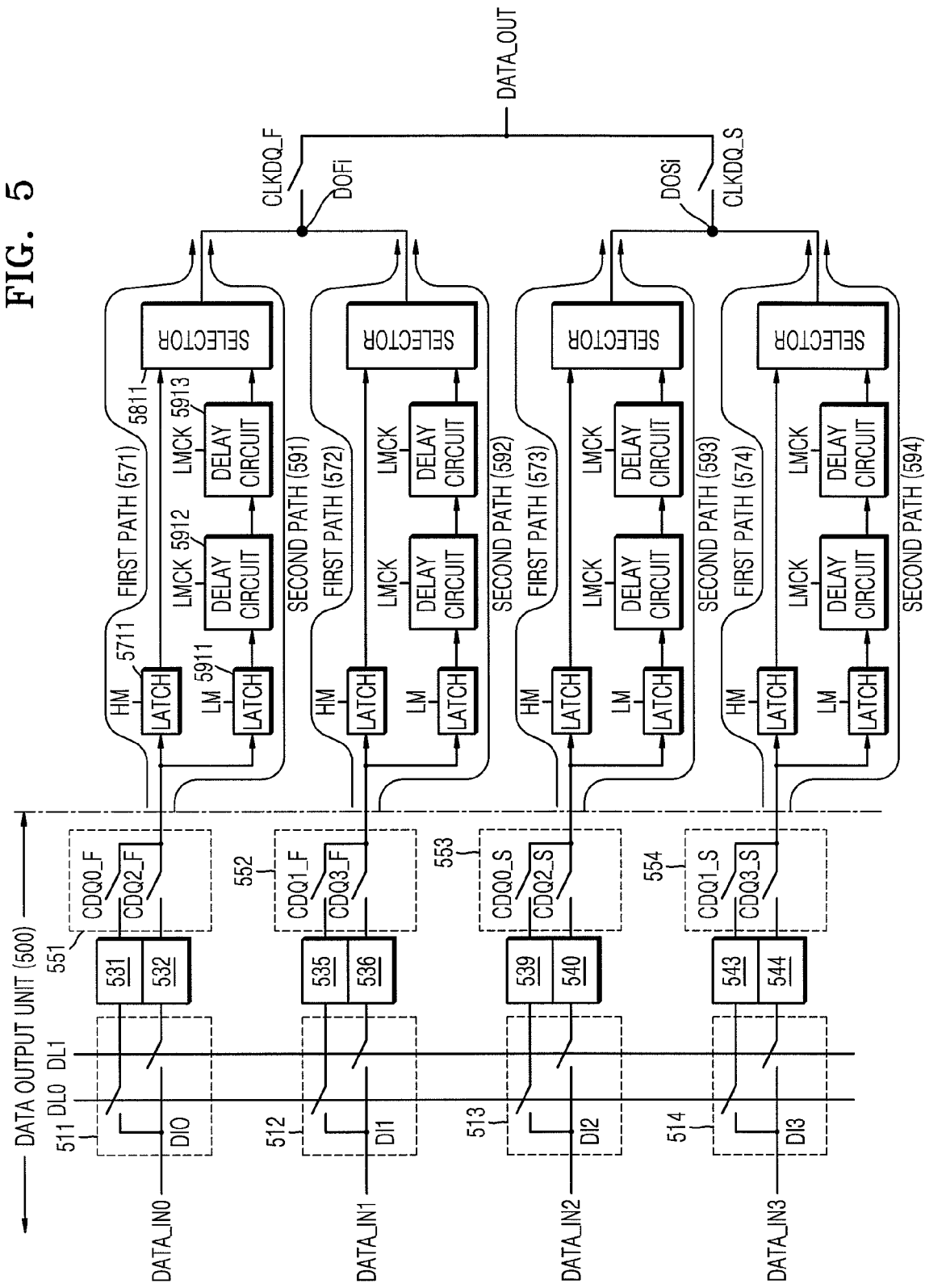
FIG. 5 is a block diagram of a wave pipelined output circuit according to a second embodiment of the present invention.

FIG. 5 is a block diagram of a wave pipelined output circuit according to a second embodiment of the present invention. Referring to FIG. 5, the output circuit according to the second embodiment of the present invention includes a data output unit 500 receiving data DATA_IN0, DATA_IN1, DATA_IN2 and DATA_IN3 read from a memory cell array (not shown) and outputting the received data in a wave pipelined manner, first paths 571, 572, 573 and 574 transferring the data output from the data output unit 500 to output ports DOFi and DOSi in the high frequency mode of the synchronous memory device, and second paths 591, 592, 593 and 594 delaying the output data of the data output unit 500 by a predetermined number of clock cycles and then transferring the delayed data to the output ports DOFi and DOSi in the low frequency mode of the synchronous memory device.

In the output circuit according to the second embodiment of the present invention, the first paths 571, 572, 573 and 574 and the second paths 591, 592, 593 and 594 are arranged behind the data output unit 500, distinguished from the output circuit according to the first embodiment of the present invention shown in FIG. 4. The data output unit 500 includes input multiplexers 511, 512, 513 and 514, registers 531, 532, 535, 536, 539, 540, 543 and 544, and output multiplexers 551, 552, 553 and 554 and has the same configuration as that of the data output unit 400 shown in FIG. 4.

Each of the first paths 571, 572, 573 and 574 includes a latch 5711 controlled by a high frequency mode control signal HM and a selector 5811. Each of the second paths 591, 592, 593 and 594 includes a latch 5911 controlled by a low frequency mode control signal LM, a plurality of delay circuits 5912 and 5913 controlled by a delay control clock signal LMCK, and the selector 5811. The configurations of the first paths 571, 572, 573 and 574 and second paths 591, 592, 593 and 594 are identical to those of the first paths 471, 472, 473 and 473 and second paths 491, 492, 493 and 494 shown in FIG. 4.

As described above, the output circuit according to the second embodiment of the present invention is distinguished from the output circuit according to the first embodiment of the present invention shown in FIG. 4 by the fact that the first paths 571, 572, 573 and 574 and the second paths 591, 592, 593 and 594 are arranged behind the data output unit 500 and has the construction and operation similar to those of the output circuit shown in FIG. 4. Accordingly, detailed description of the detailed construction and operation of the output circuit according to the second embodiment of the present invention will not be repeated.

Figure 6:
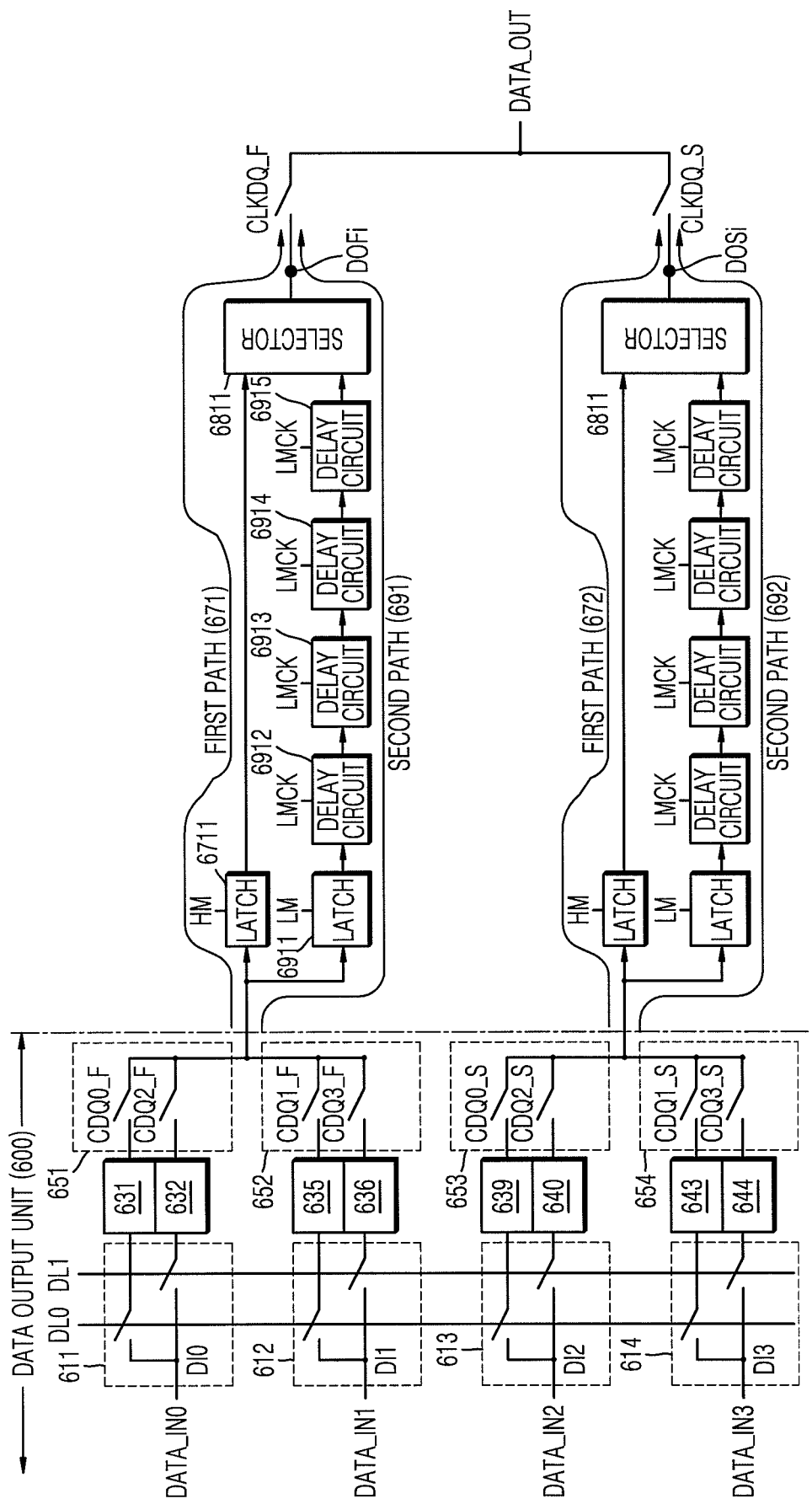
FIG. 6 is a block diagram of a wave pipelined output circuit according to a third embodiment of the present invention.

FIG. 6 is a block diagram of a wave pipelined output circuit according to a third embodiment of the present invention. Referring to FIG. 6, the output circuit according to the third embodiment of the present invention includes a data output unit 600 receiving data DATA_IN0, DATA_IN1, DATA_IN2 and DATA_IN3 read from a memory cell array (not shown) and outputting the received data in a wave pipelined manner, first paths 671 and 672 transferring the output data of the data output unit 600 to output ports DOFi and DOSi in the high frequency mode of the synchronous memory device, and second paths 691 and 692 delaying the output data of the data output unit 600 by a predetermined number of clock cycles and then transferring the delayed data to the output ports DOFi and DOSi in the low frequency mode of the synchronous memory device.

In the output circuit according to the third embodiment of the present invention, the first paths 671 and 672 and the second paths 691 and 692 are arranged behind the data output unit 600, similar to the output circuit according to the second embodiment of the present invention shown in FIG. 5. The output circuit according to the third embodiment of the invention includes the two first paths 671 and 672 and the two second paths 691 and 692 while the output circuit according to the second embodiment of the invention includes the four first paths 571, 572, 573 and 574 and the four second paths 591, 592, 593 and 594.

Each of the first paths 671 and 672 includes a latch 6711 controlled by a high frequency mode control signal HM and a selector 6811. Each of the second paths 691 and 692 includes a latch 6911 controlled by a low frequency mode control signal LM, four delay circuits 6912, 6813, 6914 and 6915 controlled by a delay control clock signal LMCK, and the selector 6811. The configuration of the first paths 671 and 672 is identical to that of the first paths 571, 572, 573 and 574 of the output circuit according to the second embodiment of the invention shown in FIG. 5. The second paths 691 and 692 are distinguished from the second paths 591, 592, 593 and 594 shown in FIG. 5 by the fact that the four delay circuits 6912, 6913, 6914 and 6914 are included in each of the second paths 691 and 692.

The data output unit 600 includes input multiplexers 611, 612, 613 and 614, registers 631, 632, 635, 636, 639, 640, 643 and 644, and output multiplexers 651, 652, 653 and 654 and has the same configuration as that of the data output unit 500 shown in FIG. 5.

As described above, the output circuit according to the third embodiment of the present invention includes the two first paths 671 and 672 and the two second paths 691 and 692 and each of the second paths 691 and 692 includes the four delay circuits 6912, 6913, 6914 and 6915, distinguished from the output circuit according to the second embodiment of the present invention shown in FIG. 5. The overall construction and operation of the output circuit according to the third embodiment of the invention are similar to those of the output circuit according to the second embodiment of the invention so that detailed description thereof will not be repeated.

In the wave pipelined output circuit according to the present invention, the number of registers used in the high frequency mode and the number of control signals used for data input/output of the registers are reduced compared to the conventional output circuit. Consequently, loads of the data output paths in the high frequency mode is reduced, and thus the high frequency operation can be improved and the chip area of the output circuit can be decreased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wave pipelined output circuit of a synchronous memory device comprising:
   a data output unit latching data input through input ports in response to a plurality of latch control signals and outputting the latched data in response to a plurality of output control signals;
   first paths transferring data read from a memory cell array to the input ports of the data output unit in a high frequency mode of the synchronous memory device; and
   second paths delaying the read data by a predetermined number of clock cycles and then transferring the delayed data to the input ports of the data output unit in a low frequency mode of the synchronous memory device.

2. The wave pipelined output circuit of claim 1, wherein each of the first paths comprises:
   a latch latching the read data in response to a control signal activated in the high frequency mode; and
   a selector receiving the data latched in the latch and outputting the data to the corresponding input port of the data output unit.

3. The wave pipelined output circuit of claim 1, wherein each of the second paths comprises:
   a latch latching the read data in response to a control signal activated in the low frequency mode;
   a plurality of delay circuits serially connected to the output port of the latch, each of the plurality of delay circuits delaying data input through the input port thereof by one clock cycle; and
   a selector receiving the output signal of the last delay circuit of the plurality of delay circuits and outputting the output signal to the corresponding input port of the data output unit.

4. The wave pipelined output circuit of claim 3, wherein each of the delay circuits includes a register storing data input to the input port thereof in response to a delay control clock signal.

5. The wave pipelined output circuit of claim 4, wherein the delay control clock signal has the same cycle as that of the operating clock signal of the synchronous memory device.

6. The wave pipelined output circuit of claim 1, wherein the high frequency mode is a mode in which a delay locked loop circuit included in the synchronous memory device is operated.

7. The wave pipelined output circuit of claim 6, wherein the low frequency mode is a mode in which the delay locked loop circuit is not operated.

8. The wave pipelined output circuit of claim 1, wherein the data output unit comprises:
   a plurality of registers;
   input multiplexers outputting data input through the input ports via the first paths or the second paths to the plurality of registers in response to the plurality of latch control signals; and
   output multiplexers sequentially outputting the data latched in the plurality of registers in response to the plurality of output control signals.

9. A wave pipelined output circuit of a synchronous memory device comprising:
   a data output unit receiving data read from a memory cell array through input ports, latching the data in response to a plurality of latch control signals and outputting the latched data in response to a plurality of output control signals;
   first paths transferring the data output from the data output unit to output ports in a high frequency mode of the synchronous memory device; and
   second paths delaying the data output from the data output unit by a predetermined number of clock cycles and then transferring the delayed data to the output ports in a low frequency mode of the synchronous memory device.

10. The wave pipelined output circuit of claim 9, wherein each of the first paths comprises:
    a latch latching the data output from the data output unit in response to a control signal activated in the high frequency mode; and
    a selector receiving the data latched in the latch and outputting the data to the corresponding output port.

11. The wave pipelined output circuit of claim 9, wherein each of the second paths comprises:
    a latch latching the data output from the data output unit in response to a control signal activated in the low frequency mode;
    a plurality of delay circuits serially connected to the output port of the latch, each of the plurality of delay circuits delaying data input through the input port thereof by one clock cycle; and
    a selector receiving the output signal of the last delay circuit of the plurality of delay circuits and outputting the output signal to the corresponding output.

12. The wave pipelined output circuit of claim 11, wherein each of the delay circuits includes a register storing data input to the input port thereof in response to a delay control clock signal.

13. The wave pipelined output circuit of claim 12, wherein the delay control clock signal has the same cycle as that of the operating clock signal of the synchronous memory device.

14. The wave pipelined output circuit of claim 9, wherein the high frequency mode is a mode in which a delay locked loop circuit included in the synchronous mery device is operated.

15. The wave pipelined output circuit of claim 14, wherein the low frequency mode is a mode in which the delay locked loop circuit is not operated.

16. The wave pipelined output circuit of claim 9, wherein the data output unit comprises:
    a plurality of registers;
    input multiplexers receiving data read from the memory cell array and outputting the data to the plurality of registers in response to the plurality of latch control signals; and
    output multiplexers sequentially outputting the data latched in the plurality of registers in response to the plurality of output control signals.

* * * * *